(12) United States Patent
Ozawa et al.

(10) Patent No.: US 7,999,304 B2
(45) Date of Patent: Aug. 16, 2011

(54) SEMICONDUCTOR DEVICE

(75) Inventors: Yoshio Ozawa, Yokohama (JP); Akihito Yamamoto, Naka-gun (JP); Katsuaki Natori, Yokohama (JP); Masayuki Tanaka, Yokohama (JP); Katsuyuki Sekine, Yokohama (JP); Daisuke Nishida, Yokohama (JP); Ryota Fujitsuka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 584 days.

(21) Appl. No.: 12/026,942

(22) Filed: Feb. 6, 2008

(65) Prior Publication Data

US 2008/0197403 A1    Aug. 21, 2008

(30) Foreign Application Priority Data

Feb. 7, 2007   (JP) ................... 2007-028385

(51) Int. Cl.
    *H01L 29/76*  (2006.01)
(52) U.S. Cl. ........ 257/321; 257/314; 257/315; 257/317; 257/325; 257/390; 257/E29.304; 257/E29.309
(58) Field of Classification Search .......... 257/314–315, 257/317, 321, 325, 390, E29.304, E29.309
    See application file for complete search history.

(56) References Cited

U.S. PATENT DOCUMENTS 6,933,218 B1   8/2005   Lee et al.
7,199,425 B2   4/2007   Ozawa
2005/0145925 A1 *  7/2005   Ozawa ......................... 257/315
2005/0280069 A1   12/2005   Mizushima et al.
2007/0241389 A1   10/2007   Ozawa et al.

FOREIGN PATENT DOCUMENTS

| JP | 07-297302 | 11/1995 |
| JP | 2003-31705 | 1/2003 |
| JP | 2004-349650 | 12/2004 |
| JP | 2005-197363 | 7/2005 |

OTHER PUBLICATIONS

Notification for Filing Opinion mailed on Jul. 29, 2010, in corresponding Korean Application No. 10-2008-11627.

* cited by examiner

*Primary Examiner* — Cuong Q Nguyen
*Assistant Examiner* — Trang Q Tran
(74) *Attorney, Agent, or Firm* — Finnegan, Henderson, Farabow, Garrett & Dunner, L.L.P.

(57) ABSTRACT

A semiconductor device includes a semiconductor substrate, and nonvolatile memory cells, each of the cells including a channel region having a channel length and a channel width, a tunnel insulating film, a floating gate electrode, a control gate electrode, an inter-electrode insulating film between the floating and control gate electrodes, and an electrode side-wall insulating film on side-wall surfaces of the floating and control gate electrodes, the electrode side-wall insulating film including first and second insulating films having first and second dielectric constants, the first dielectric constant being higher than the second dielectric constant, the second dielectric constant being higher than a dielectric constant of a silicon nitride film, the first insulating film being in a central region of a facing region between the floating and control gate electrodes, the second insulating region being in the both end regions of the facing region and protruding from the both end portions.

8 Claims, 12 Drawing Sheets

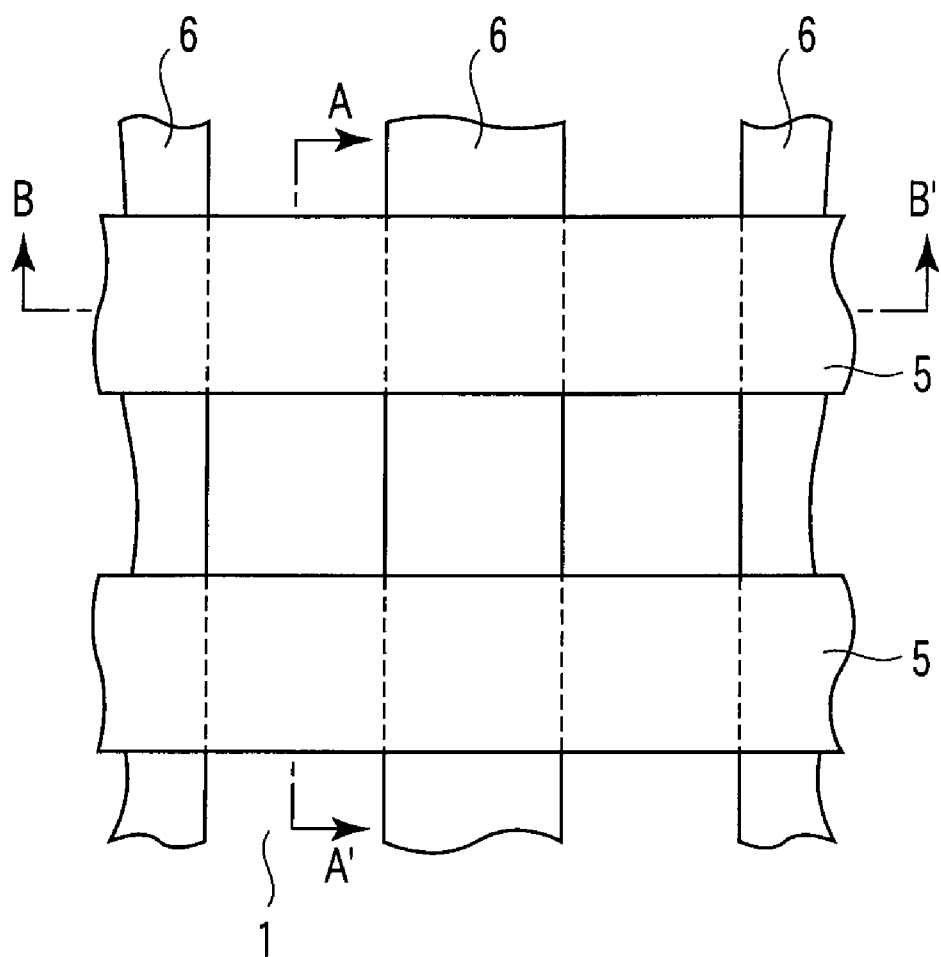
F I G. 1

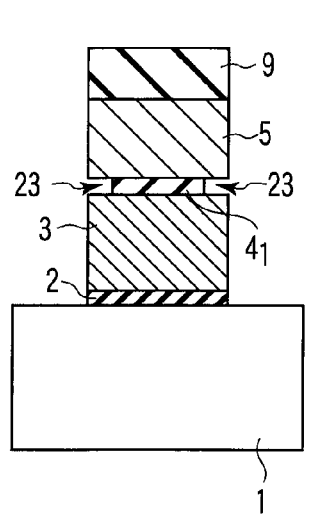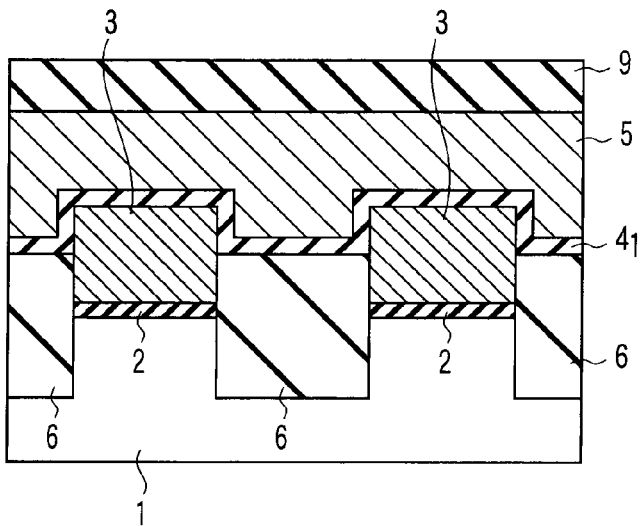
FIG. 7A  FIG. 7B
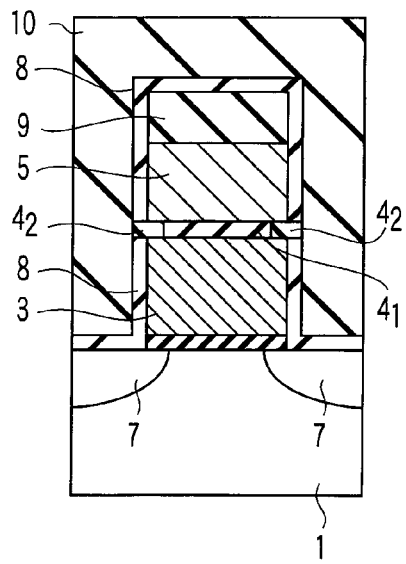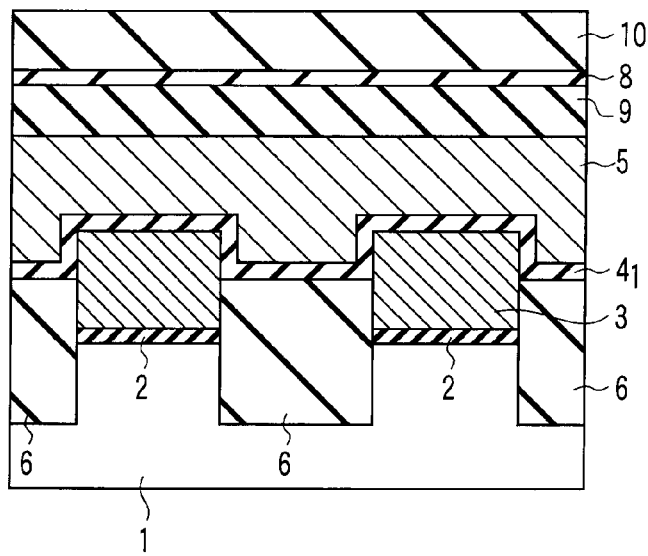
FIG. 8A  FIG. 8B

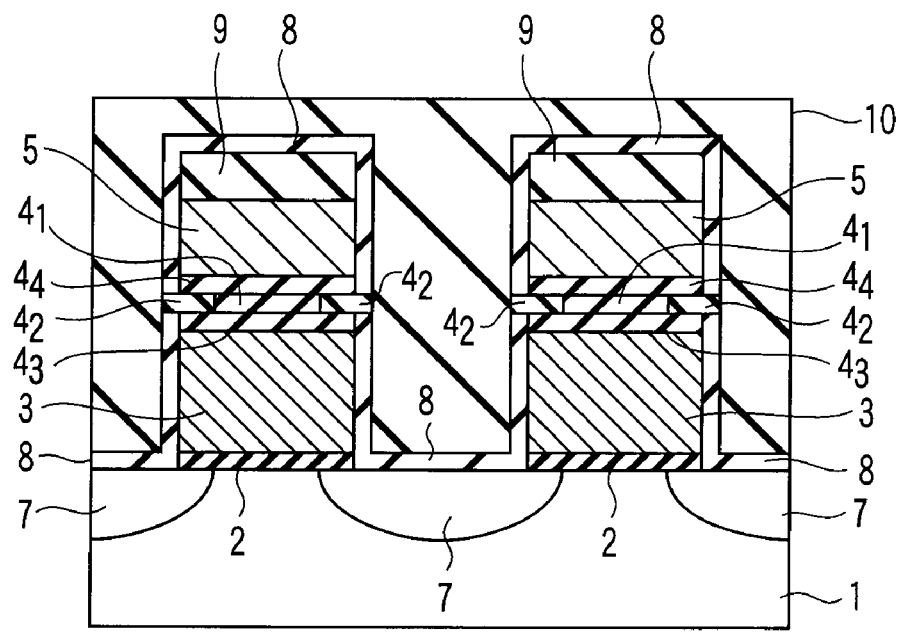
F I G. 9
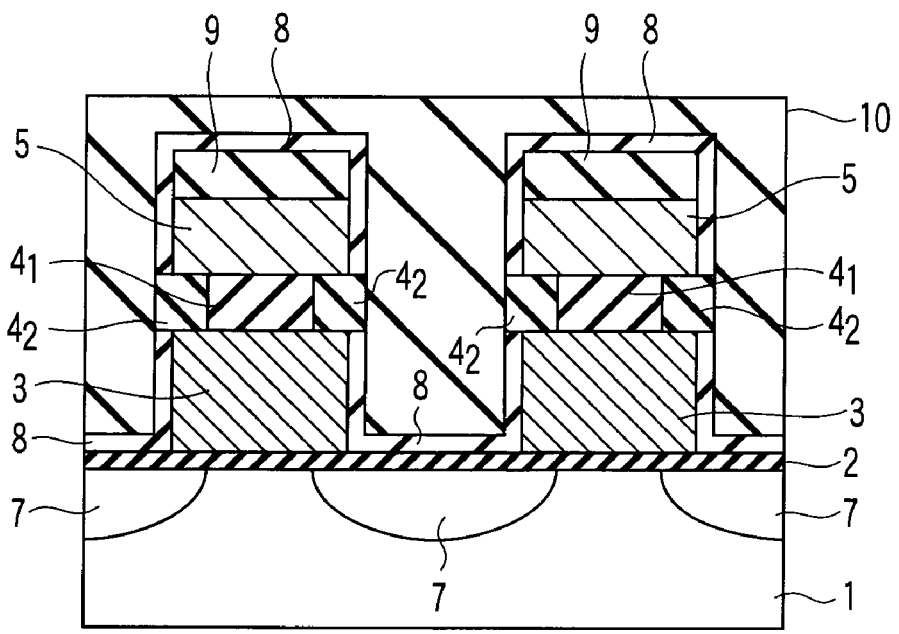
F I G. 10

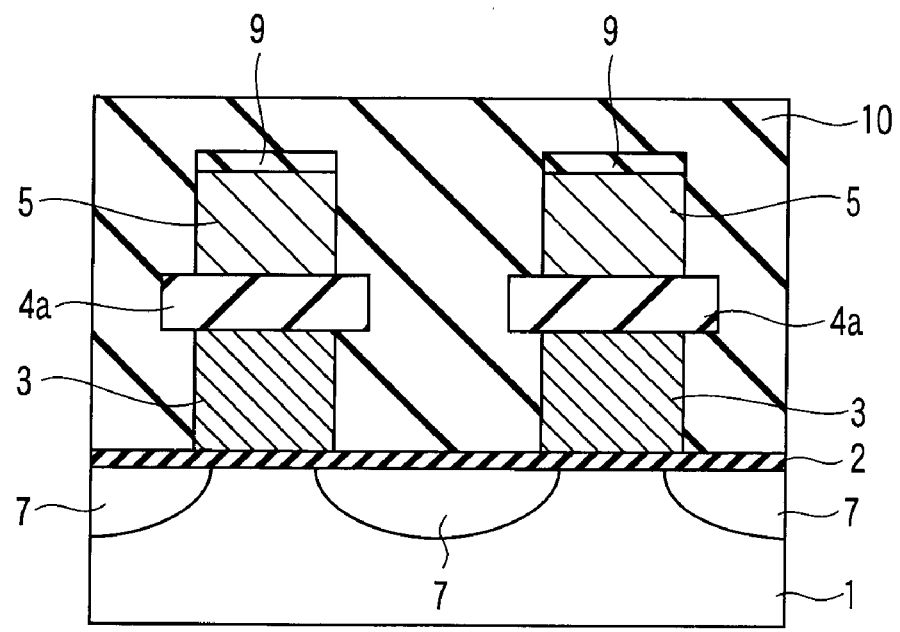
F I G. 15
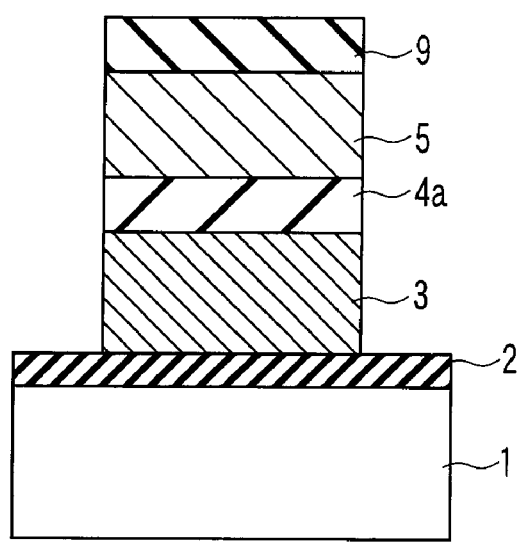
F I G. 16

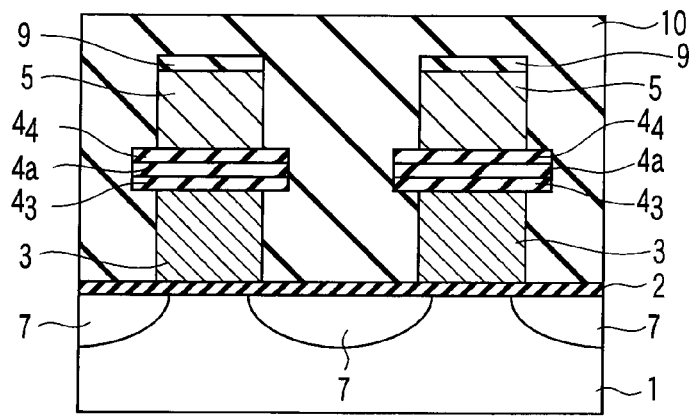
F I G. 19
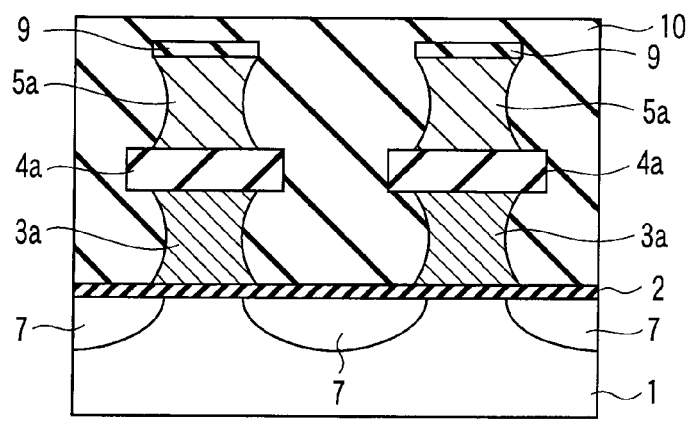
F I G. 20
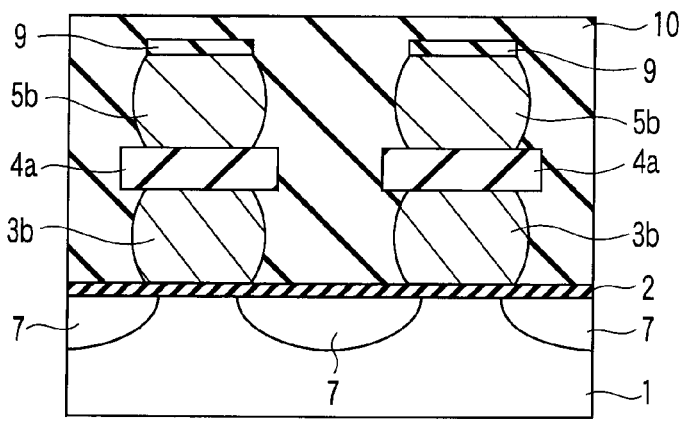
F I G. 21

SEMICONDUCTOR DEVICE

CROSS-REFERENCE TO RELATED APPLICATIONS

This application is based upon and claims the benefit of priority from prior Japanese Patent Application No. 2007-028385, filed Feb. 7, 2007, the entire contents of which are incorporated herein by reference.

BACKGROUND OF THE INVENTION

1. Field of the Invention

The present invention relates to a semiconductor device comprising electrically rewritable nonvolatile memory cells.

2. Description of the Related Art

FIG. 26 shows a memory cell structure of a nonvolatile semiconductor memory device using a high dielectric constant insulating film as an inter-electrode insulating film according to the conventional technique (Jpn. Pat. Appln. KOKAI Publication No. 2004-349650). FIG. 26 shows sectional views of nonvolatile memory cells adjacent to each other in a bit line direction (channel length direction).

Floating gate electrodes 93 are provided on a silicon substrate 91 via tunnel insulating films 92, and control gate electrodes 95 are provided on the floating gate electrodes 93 via inter-electrode insulating films 94. Silicon nitride films 96 used as processing masks are provided on the control gate electrodes 95. In addition, source and drain regions 97 are provided on the surface of the silicon substrate 91. And side faces and top faces of gate structure portions each comprising the tunnel insulating films 92, the floating gate electrodes 93, the inter-electrode insulating films 94, the control gate electrodes 95 and the silicon nitride films 96 are covered with a silicon oxide film 98 called an electrode side-wall oxide film and a BPSG (boron phosphorous silicate glass) film 99 as an interlayer insulating film.

Here, the inter-electrode insulating films 94 each include first dielectric regions $94_1$ and second dielectric regions $94_2$ having a lower dielectric constant than that of the first dielectric region $94_1$, and the second dielectric regions $94_2$ are provided on end portions of the first dielectric regions $94_1$ in the channel length direction.

As constituent material for the first dielectric regions $94_1$, alumina or tantalum oxide are disclosed, and as constituent materials for the second dielectric regions $94_2$, silicon oxide, silicon nitride, silicon oxynitride or BPSG are disclosed.

In the memory cell structure, the second dielectric regions $94_2$ having low dielectric constants exist on the top faces of the end portions of the floating gate electrodes 93, thereby, parasitic capacitance between the top faces of the floating gate electrodes 93 owned by adjacent memory cells decreases, effect for avoiding memory malfunction is obtained.

However, due to an existence of the second dielectric regions $94_2$ having low dielectric constants exist, electric capacitance between the top faces of the floating electrodes 93 and bottom faces of the control gate electrodes 95 in the same memory cells decreases, in addition, electric capacitance between the side faces of the floating gate electrodes 93 and the side faces of the control gate electrodes 95 also decreases. Therefore, coupling ratio of the memory cell decreases, and there arises a problem of lowering operation speed of the memory cell.

Here, the coupling ratio is defined as a ratio of voltage applied to the tunnel insulating film to a voltage applied to the control gate, and the ratio is approximately expressed as C2/(C1+C2) if electric capacitance between the substrate and the floating gate is set to C1 and electric capacitance between the floating gate electrode and the control gate electrode is set to C2.

BRIEF SUMMARY OF THE INVENTION

According to an aspect of the present invention, there is provided a semiconductor device comprising: a semiconductor substrate; and a plurality of nonvolatile memory cells provided on the semiconductor substrate, each of the plurality of nonvolatile memory cells comprising: a channel region provided on the semiconductor substrate and having a channel length and a channel width; a tunnel insulating film provided on the channel region; a floating gate electrode provided on the tunnel insulating film; a control gate electrode provided above the floating gate; an inter-electrode insulating film provided between the floating gate electrode and the control gate electrode; and an electrode side-wall insulating film provided on side-wall surfaces of the floating gate electrode and the control gate electrode, the inter-electrode insulating film including a first insulating film having a first dielectric constant and a second insulating film having a second dielectric constant, the first dielectric constant being higher than the second dielectric constant, the second dielectric constant being higher than a dielectric constant of a silicon nitride film, the first insulating film being provided in a central region of a facing between the floating gate electrode and the control gate electrode, the second insulating film being provided in both end regions of the facing region and protruding from the both end regions, wherein the central region is a region of the facing region except for the both end regions.

According to another aspect of the present invention, there is provided a semiconductor device comprising: a semiconductor substrate; and a plurality of nonvolatile memory cells provided on the semiconductor substrate, each of the plurality of nonvolatile memory cells comprising: a channel region provided on the semiconductor substrate and having a channel length and a channel width; a tunnel insulating film provided on the channel region; a floating gate electrode provided on the tunnel insulating film; a control gate electrode provided above the floating gate; an inter-electrode insulating film having a first dielectric constant higher than that of a silicon nitride film, the inter-electrode insulating film being provided between the floating gate electrode and the control gate electrode and being protruded from side-wall surfaces of the floating gate electrode and the control gate electrode; and an insulating film covering side-wall surfaces of the floating gate electrode and the control gate electrode and having a second dielectric constant lower than the first dielectric constant.

BRIEF DESCRIPTION OF THE SEVERAL VIEWS OF THE DRAWING

FIG. 1 is a plain view illustrating a semiconductor device in accordance with a first embodiment of the invention;

FIGS. 7A and 7B are cross-sectional views illustrating manufacturing process for the semiconductor device of the first embodiment following FIGS. 6A and 6B;

FIGS. 8A and 8B are cross-sectional views illustrating manufacturing process for the semiconductor device of the first embodiment following FIGS. 7A and 7B;

FIG. 9 is a cross-sectional view for explaining a modification of the first embodiment;

FIG. 10 is a cross-sectional view for explaining another modification of the first embodiment;

FIG. 15 is a cross-sectional view illustrating a semiconductor in accordance with a third embodiment;

FIG. 16 is a cross-sectional view illustrating a manufacturing process for the semiconductor device of the third embodiment;

FIG. 19 is a cross-sectional view for explaining a modification of the third embodiment;

FIG. 20 is a cross-sectional view for explaining another modification of the third embodiment;

FIG. 21 is a cross-sectional view for explaining yet another modification of the third embodiment;

DETAILED DESCRIPTION OF THE INVENTION

Hereinafter, embodiments of the present invention will be described with reference to the drawings.

First Embodiment

FIG. 1 is a plain view depicting a semiconductor device in accordance with a first embodiment. More specifically, FIG. 1 is a plain view depicting a plurality of nonvolatile memory cells (hereinafter, simply referred to as memory cells) constituting a memory cell array in a semiconductor device.

Figure 2:
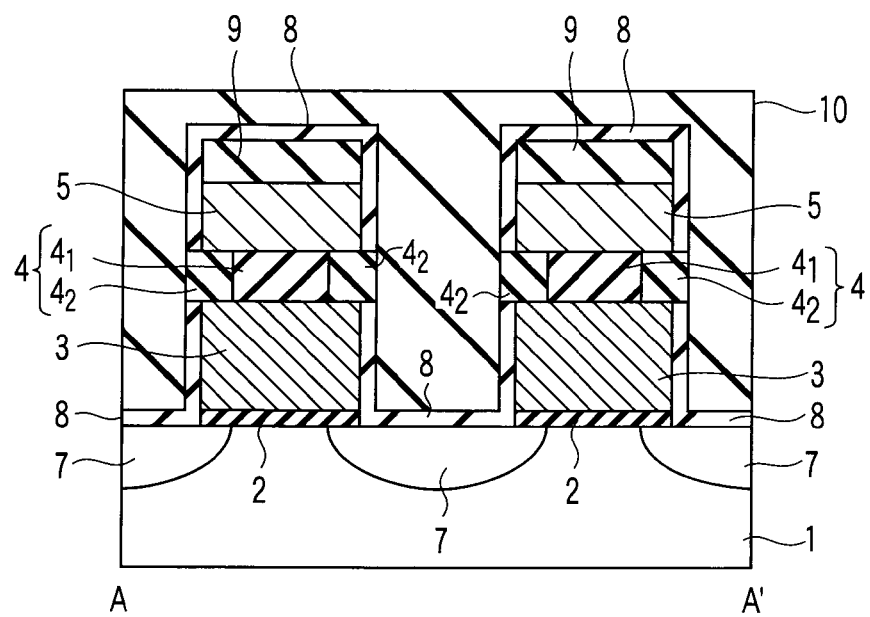
FIG. 2 is a cross-sectional view illustrating a cross-section along a line segment A-A' of FIG. 1.
Figure 3:
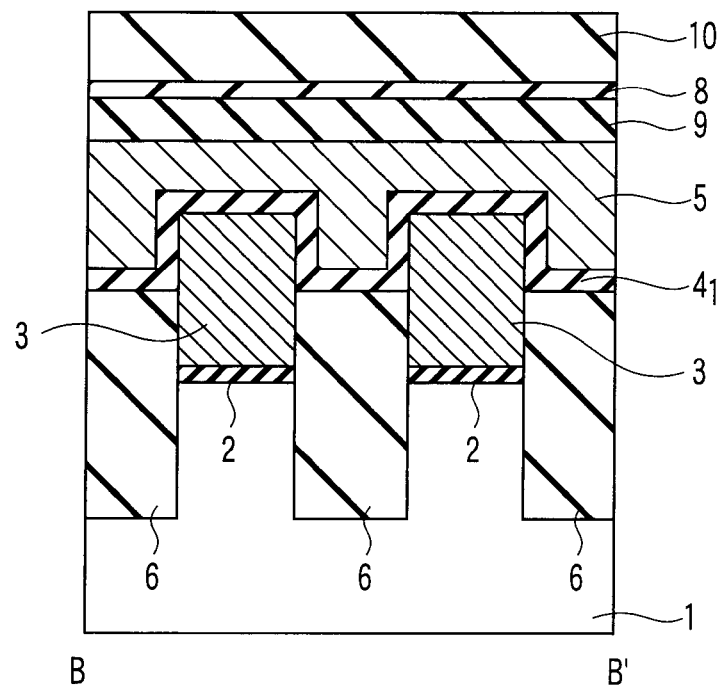
FIG. 3 is a cross-sectional view illustrating a cross-section along a line segment B-B' of FIG. 1.

FIG. 2 and FIG. 3 show a cross-sectional view depicting a cross-sectional view along a line segment A-A' (cross-sectional view in a channel length direction) of FIG. 1 and a cross-sectional view depicting a cross-sectional view along a line segment B-B' (cross-sectional view in a channel width direction) of FIG. 1, respectively.

The memory cell array constitutes a nonvolatile memory such as a NAND type flash memory. More specifically, the semiconductor device is an electronic device such as a nonvolatile memory itself or a music reproduction device comprising the nonvolatile memory.

Each memory cell includes a tunnel insulating film, a floating gate electrode, a control gate electrode, an inter-electrode insulating film and source/drain regions. The following will further describe the memory cell of the present embodiment.

Isolation trench is provided on the surface of a silicon substrate 1, and the trench is filled with an isolation insulating film 6. The isolation trench and the isolation insulating film 6 constitute a shallow trench isolation region (STI). This isolation region defines active areas (AA regions) including a channel region of the memory cell in the silicon substrate 1. The channel region has a channel length direction and a channel width direction. The channel length direction (direction between source and drain) is a direction in which a current flows. The channel width direction is a direction orthogonal to the channel length direction.

Tunnel insulating films 2 are provided on the channel region of the active areas. The tunnel insulating films 2 comprises, for example, silicon oxide films or silicon oxynitride films. Floating gate electrodes 3 are provided on the tunnel insulating films 2.

Above the floating gate electrodes 3, control gate electrodes 5 are provided. Inter-electrode insulating films 4 comprising a first insulating film $4_1$ and a second insulating film $4_2$ are provided between the floating gate electrodes 3 and the control gate electrodes 5. Silicon nitride films 9 used as processing masks are provided on the control gate electrodes 9. Insulating films other than the silicon nitride films 9 may be also used as the processing masks.

Here, a dielectric constant $\in1$ of the first insulating film $4_1$ is higher than a dielectric constant $\in2$ of the second insulating film $4_2$ ($\in1 > \in2$). The electric constant $\in2$ of the second insulating film $4_2$ is higher than a dielectric constant of the silicon nitride film (about 7 as a relative dielectric constant). That is to say, the first insulating film $4_1$ and the second insulating film $4_2$ comprise insulating films so-called high dielectric constant insulating films (high-k films).

The first insulating film $4_1$ is, for example, a hafnium aluminate film, a hafnia film or a lanthanum aluminate film. The second insulating film $4_2$ is, for example, an alumina film. The combination of the insulating films $4_1$ and $4_2$ is not limited to the foregoing combination. In addition, in a case where insulating films having the same constituent elements are used as the first and the second insulating films $4_1$ and $4_2$, the dielectric constants of the insulating films $4_1$ and $4_2$ can be changed by changing their elemental composition ratios.

As shown in FIG. 2, the first insulating films $4_1$ are provided in center portions between the floating gate electrodes 3 and the control gate electrodes 5 in the channel length direction. Therefore, the width of the first insulating films $4_1$ is narrower than the width of the floating gate electrodes 3 and the widths of the control gate electrodes 5.

As shown in FIG. 2, the second insulating films $4_2$ are provided in both sides (end portions) of the first insulating films $4_1$, and protruded outside of facing regions of the floating gate electrodes 3 and the control gates electrodes 5. Each of the second insulating films $4_2$ of the portions protruded outside of the facing regions between the floating gate electrodes 3 and the control gate electrodes 5 constitutes a part of an electrode side-wall insulating films. The electrode side-wall insulating films are insulating films covering side faces of gate structure portions comprising the tunnel insulating films, the floating gate electrodes, the control gate electrodes and the inter-electrode insulating films.

In FIG. 2 and FIG. 3, relating to the insulating films constituting the electrode side-wall insulating films, insulating films other than the second insulating films $4_2$ are designated by reference symbols 8. In the present embodiment, the insulating film $4_2$ and the insulating films 8 comprise the same insulating film. Hereinafter, such insulating films $4_2$ and insulating films 8 are integrally referred to as liner insulating films $4_2$ and 8.

An interlayer insulating film 10 are provided on the liner insulating films $4_2$ and 8. Material of the insulating film 10 is selected so that the dielectric constant of the interlayer insulating film 10 is equal to or lower than the dielectric constant of the silicon nitride film. As this kind of interlayer insulating film 10, for example, an insulating film such as a silicon oxide film or a silicon oxynitride film are mentioned. Source/drain regions 7 are provided on the silicon substrate 1 so as to sandwich the channel regions of the memory cells.

According to the first embodiment, since the first and second insulating films $4_1$ and $4_2$ having higher dielectric constants than that of the silicon nitride film are provided in the facing regions between the floating gate regions 3 and the control gate regions 5, high coupling ratios is realized, thereby, speeding up of operation or lowering of operation voltage is realized. Further, since the liner insulating films 42 and 8 having higher dielectric constants than that of the silicon nitride film are provided on the side-wall regions of the floating gate electrodes 3 and the control gate electrodes 5, the electric capacitance between the side walls of the floating gate electrodes 3 and the side walls of the control gate electrodes 5 is increased, so the coupling ratio is made to be higher.

In addition, since the second insulating film $4_2$ having lower dielectric constant than that of the center region is provided in the end portion region of the facing region between the floating gate electrode 3 and the control gate electrode 5, increasing of electric field caused by the sharp electrode end portion shape is reduced. Thereby, local leak current is suppressed, and this enables the memory cells to be high in reliability.

Moreover, since the liner insulating films $4_2$, 8 and the interlayer insulating film 10 having lower dielectric constants than that of the first insulating film $4_1$ are provided in the facing region between floating gate electrodes 3 of the adjacent memory cells and the facing region between control gate electrodes 5 of the adjacent memory cells, parasitic capacitances between adjacent floating gate electrodes 3 and between the control gate electrodes 5 are reduced, thereby malfunctions of the memory cells can be avoided.

As mentioned above, according to the first embodiment, (1) a high coupling ratio, (2) lowering of an electric field at an electrode end portion, and (3) reduction in parasitic capacitances between adjacent floating gate electrodes 3 and between adjacent control gate electrodes 5 are simultaneously realized.

Referring now from FIGS. 4A, 4B to FIGS. 8A, 8B, a manufacturing method for the semiconductor device of the first embodiment will be described. FIGS. 4A to 8A show sectional views in a bit line direction (channel length direction) and sectional views in a word line direction (channel width direction).

Figures 4A, 4B:
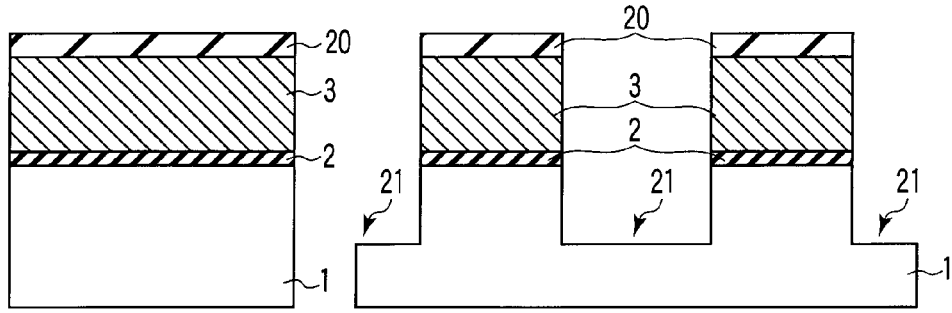
FIGS. 4A and 4B are cross-sectional views illustrating manufacturing process for a semiconductor device of the first embodiment.

[FIGS. 4A and 4B]

A tunnel insulating film (here, a tunnel oxynitride film) 2 of a thickness of 6 nm is formed on the surface of the silicon substrate 1 with desired impurities doped therein by combining a thermal oxidation method and a thermal nitriding method, thereafter, a phosphorus doped polycrystalline silicon layer 3 of a thickness of 100 nm to be the floating gate electrode and a mask material 20 for isolation processing are successively deposited by chemical vapor deposition (CVD) method.

The mask material 20, the polycrystalline silicon layer 3 and the tunnel insulating film 2 are successively etched by reactive ion etching (RIE) method using a first resist mask (not shown), and further, the exposed region of the silicon substrate 1 is etched, and then, an isolation trench 21 of a depth of 100 nm is formed. At this time, both the widths of the trench 21 and the silicon layer 3 are equal to about 50 nm.

Figures 5A, 5B:
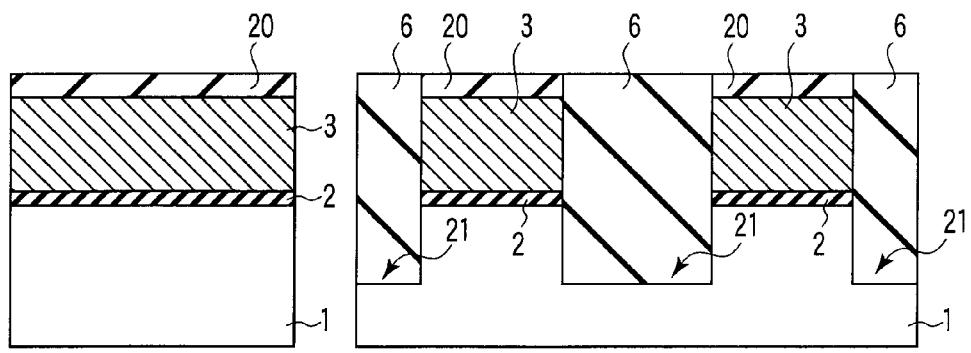
FIGS. 5A and 5B are cross-sectional views illustrating manufacturing process for the semiconductor device of the first embodiment following FIGS. 4A and 4B.

[FIGS. 5A and 5B]

An isolation insulating film (here, a silicon oxide film) 6 is deposited on the entire surface, the isolation trench 21 is filled, and then, a surface portion of the insulating film 6 is removed by chemical mechanical polish (CMP) method to planarize the surface. At this time, the mask material 20 is exposed.

Figures 6A, 6B:
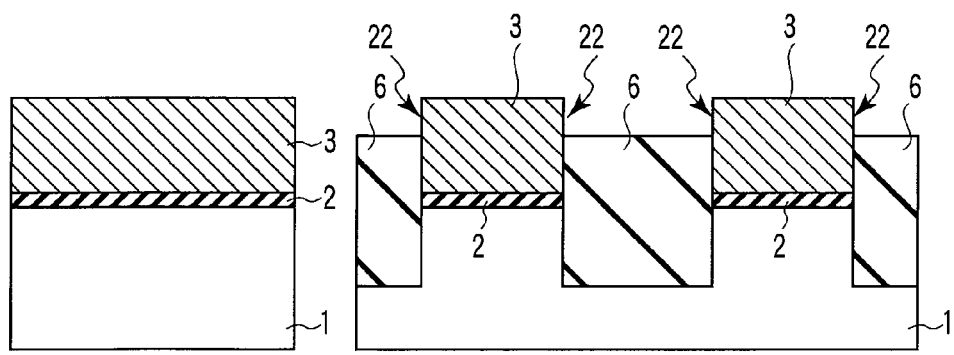
FIGS. 6A and 6B are cross-sectional views illustrating manufacturing process for the semiconductor device of the first embodiment following FIGS. 5A and SB.

[FIGS. 6A and 6B]

The mask material 20 is selectively removed by etching using chemical solution or the like, further, the exposed surface of the insulating film 6 is removed by etching using a dilute hydrofluoric acid solution, and thereby an upper side face 22 of the silicon layer 3 is exposed. The height of the side face 22 is equal to 50 nm.

[FIGS. 7A and 7B]

A hafnium aluminate film $4_1$ of a thickness of 15 nm to be the first insulating film is deposited on the entire surface by CVD method. A conductor layer 5 of two-layer structure comprising a polycrystalline silicon layer (lower layer) and a tungsten silicide layer (upper layer) on the alumina film $4_1$ to be the control gate electrode, is formed. The thickness of the conductor layer 5 is, for example, equal to 100 nm. The polycrystalline silicon layer and the tungsten silicide layer are successively formed, for example, by CVD method.

A silicon nitride film 9 to be used as the mask material at the time of RIE-processing is formed by CVD method on the conductor layer 5.

Furthermore, by RIE method using a second resist mask (not shown) having a pattern orthogonal to the first resist mask, the silicon nitride film 9, the conductor layer 5, the hafnium aluminate film $4_1$, the polycrystalline silicon layers 3 and the tunnel insulating film 2 are successively processed, thereby the floating gate electrodes 3 and the control gate electrodes 5 are formed. At this time, both the widths and the pitch of the gate electrodes 3 are set to about 50 nm.

A void portion 23 is formed by removing the exposed surface of the hafnium aluminate film $4_1$ at the end portion of the facing region between the floating gate electrodes 3 and control gate electrode 5 by etching using the dilute hydrofluoric acid solution in order to reduce the hafnium aluminate film $4_1$ by an extent of 10 nm in a lateral direction.

[FIGS. 8A and 8B]

The liner insulating films $4_2$ and 8 comprising alumina films are formed by depositing alumina film of a thickness of around 10 nm by atomic layer deposition (ALD) method on a region including the side walls of the floating gate electrode 3, the first insulating film $4_1$ and the control gate electrode 5 and the side face and the top face of the silicon nitride film 9 so that the void portion 23 is filled.

In this case, although the liner insulating films $4_2$ and 8 comprise the insulating films of the same material formed in the same step, the liner insulating films $4_2$ and 8 may comprise insulating films of the same material formed in different steps, respectively. Further, the liner insulating films $4_2$ and 8 may comprise different kinds of insulating films, respectively. In addition, a position of the surface of the liner insulating film $4_2$ in the side-wall region of the first insulating film $4_1$ may be hollowed to the position of the surface of the liner insulating film 8 provided on the electrode side-wall region and also may be protruded from the position of the surface of the liner insulating film 8.

Thereafter, the source/drain regions 7 are formed by ion implantation method and thermal annealing followed by forming the interlayer insulating film 10 comprising a silicon oxide film by using CVD method or the like, further a wiring layer, etc., (not shown) are formed by well known technique, thereby the nonvolatile memory cells are brought to completion.

FIG. 9 shows a modification of the first embodiment. A third insulating film $4_3$ constituting a part of the inter-electrode insulating film is provided on a top face of the floating gate electrode 3, further, a fourth insulating film $4_4$ constituting a part of the inter-electrode insulating film is provided on the bottom face of the control gate electrode 5. The third and the fourth insulating films $4_3$ and $4_4$ comprise the silicon oxide film, the silicon oxynitride film or the silicon nitride film. Thereby, the insulation property between the floating gate electrode 3 and the control gate electrode 5 is improved, and the high-reliability of the memory cell is realized.

Such a structure may be realized, for example, in the step of FIGS. 7A and 7B, by forming the third insulating film $4_3$ on the floating gate electrode 3 before forming the first insulating film $4_1$, and furthermore, by forming the fourth insulating film $4_4$ on the first insulating film $4_1$ before forming the conductive layer 5.

The foregoing effects are obtained by providing only either the third insulating film $4_3$ or the fourth insulating film $4_4$. If the decreasing of electric capacitance between the floating gate electrode 3 and the control gate electrode 5 does not come into a problem, it is preferable to provide both the insulating films $4_3$ and $4_4$ because the effect for improving the insulation property is enhanced.

FIG. 10 shows another modification of the first embodiment. The tunnel insulating film 2 is provided on the entire surface of the silicon substrate 1. Since the electrode side-wall insulating films 8 comprising high dielectric insulating films do not directly contact with the silicon substrate 1 (source/drain regions 7). Therefore, an effect of decreasing junction leakage current, which is obtained by the reduction of interface states or the like, and an effect of avoiding threshold voltage fluctuations of cell transistors, which is obtained by reduction of charge trap state in the tunnel insulating film 2 adjacent to the end portion of the floating gate electrodes, are obtained. These effects enhance the reliability of the memory cells.

Figure 11:
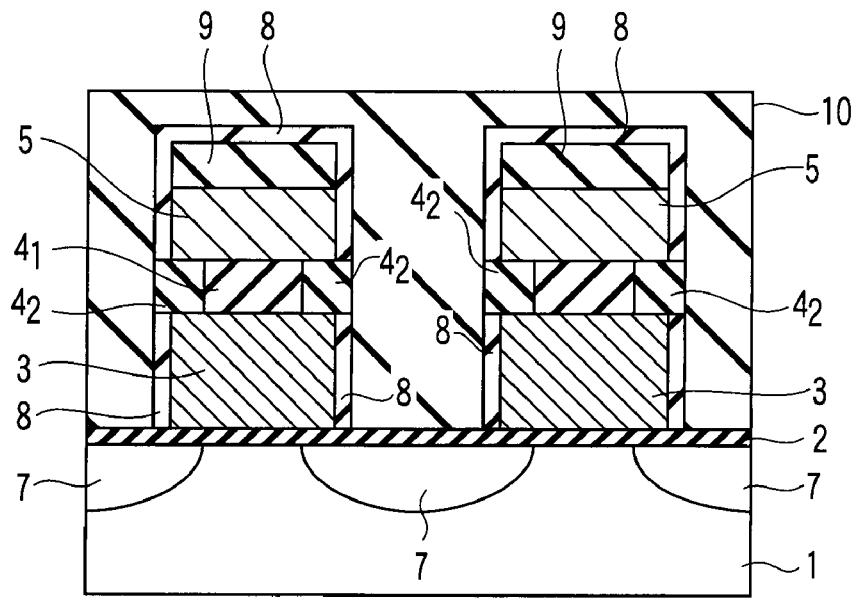
FIG. 11 is a cross-sectional view for explaining yet another modification of the first embodiment.

FIG. 11 shows another modification of the first embodiment. The modification comprises a structure that the tunnel insulating film 2 is provided on the entire surface of the silicon substrate 1, further, the electrode side-wall insulating film 8 comprising the high dielectric insulating film is removed on the exposed region of the tunnel insulating film 2 between the floating gate electrodes 3. Therefore, since the parasitic capacitances between the side-wall faces of the floating gate electrodes 3 and the source/drain regions 7 decrease, the memory cell transistors operate at high speed. In addition, since the tunnel insulating film 2 having high quality can be remained near the end portions of the floating gate electrodes 3, the reliability of the memory cells is further enhanced.

Such the structure will be realized, for instance, by performing an etching process in the step of FIGS. 7A and 7B under the condition that the tunnel insulating film 2 does not disappear, in addition, by removing the alumina film (liner insulating film) 8 on the tunnel insulating film 2 between the floating gate electrodes 3 before forming the interlayer insulating film 10, in the step of FIGS. 8A and 8B.

Second Embodiment

Figure 12:
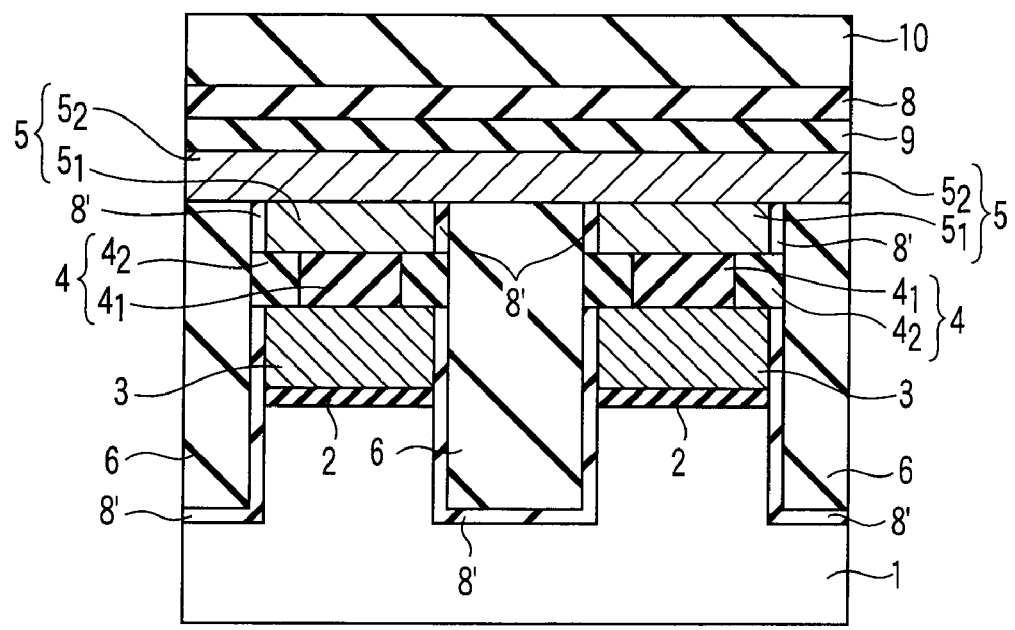
FIG. 12 is a cross-sectional view illustrating a semiconductor device in accordance with a third embodiment.

FIG. 12 is a cross-sectional view depicting a semiconductor device in accordance with a second embodiment. This depicts a cross-sectional view of a plurality of memory cells neighboring in a word line direction (channel width direction), and corresponds to FIG. 3 of the first embodiment. In the following figures, the portions corresponding to the portions shown in the previously mentioned drawings are denoted by the same reference numerals and omitted its detail explanation.

The second embodiment differs from a conventional semiconductor device in that the inter-electrode gate insulating films 4 comprises the first and the second insulating films 41, $4_2$ are formed in the cross-section in the channel width direction. In FIG. 12, 8' indicates an insulating film constituting a part of an electrode side-wall insulating film and an isolation insulating film.

The following will describe the detail of the present embodiment.

An isolation region (STI) is provided on the surface of the silicon substrate 1, and this isolation region defines the active areas in the silicon substrate 1 including the channel regions of the memory cells.

The tunnel insulating films 2 are provided on the active areas. The tunnel insulating films comprise, for example, silicon oxide films or silicon oxynitride films. The floating gate electrodes 3 are provided on the tunnel insulating films 2.

Lower layer portions $5_1$ of control gate electrodes 5 are provided above the floating gate electrodes 3. The inter-electrode insulating films 4 comprising the first insulating film $4_1$ and the second insulating film $4_2$ are provided between the floating gate electrodes 3 and the lower layer portions $5_1$ of the control gate electrodes 5.

Here, the dielectric constant ∈1 of the first insulating film $4_1$ is higher than the dielectric constant ∈2 of the second dielectric constant (∈1>∈2). The dielectric constant ∈2 of the second insulating film $4_2$ is higher than the dielectric constant of the silicon nitride film (about 7 by relative dielectric constant). That is, the first and the second insulating films $4_1$ and $4_2$ comprise the insulating films so-called high dielectric constant insulating films (high-k films).

The first insulating film $4_1$ is, for example, a hafnium aluminate film, a hafnia film or a lanthanum aluminate film. The second insulating film $4_2$ is, for example, an alumina film. The combination of the insulating films $4_1$ and $4_2$ is not limited to the given combination. In addition, in a case where insulating films having the same constituent elements are used as the first and the second insulating films $4_1$ and $4_2$, the dielectric constants of the insulating films $4_1$ and $4_2$ can be changed by changing their elemental composition ratios.

As shown in FIG. 12, the first insulating films $4_1$ are provided in center portions between the floating gate electrodes 3 and the lower layer portions $5_1$ of the control gate electrodes 5 in the channel width direction. Therefore, the widths of the first insulating films $4_1$ are narrower than those of the floating gate electrodes 3 and of the lower layer portions $5_1$ of the control gate electrodes 5.

As shown in FIG. 12, the second insulating films $4_2$ are provided in both sides (end portions) of the first insulating films $4_1$, protruded outside the facing regions of the floating gate electrodes 3 and the lower parts $5_1$ of the control gate electrodes 5.

An inner wall portion of trench (isolation trench) comprising the isolation region, that is, the exposed surfaces of the silicon substrate 1, the tunnel insulating films 2, the floating gate electrodes 3, the first insulating films $4_1$ and the lower layer portions $5_1$ of the control gate electrodes 5 are covered with the second insulating films $4_2$ and the insulating films 8'. Further, the isolation trench is filled, for example, with the isolation insulating film 6 comprising the silicon oxide films or silicon oxynitride films.

Upper layer portion $5_2$ of the control gate electrode 5 is provided on the top faces of the lower layer portions $5_1$ of the control gate electrodes 5, the isolation insulating film 6 and the insulating films 8'. The silicon nitride film (processing mask) 9, the electrode side-wall insulating film 8, and the interlayer insulating film 10 are provided on the upper layer portion $5_2$ of the control gate electrode 5.

The material of the interlayer insulating film 10 is selected so that the dielectric constant of the interlayer insulating film 10 is equal to or lower than the dielectric constant of the silicon nitride film. As this kind of interlayer insulating film 10, for example, an insulating film such as a silicon oxide film or a silicon oxynitride film are mentioned. Source/drain regions are provided on the surface of the silicon substrate 1 so as to sandwich the channel regions of the memory cells.

According to the present embodiment, since the first and the second insulating films $4_1$ and $4_2$ having higher dielectric constants than that of the silicon nitride film are provided in the facing regions between the floating gate regions 3 and the control gate regions 5, high coupling ratios is realized, thereby, speeding up of operation or lowering of operation voltage is realized.

In addition, since the second insulating film $4_2$ having a lower dielectric constant than that of the center region is provided in the end portion region of the facing region between the floating gate electrode 3 and the control gate electrode 5, increasing of electric field caused by the sharp electrode end portion shape is reduced. Thereby, local leakage current is suppressed, and this enables the memory cells to be high in reliability.

Moreover, since the second insulating film $4_2$ having the lower dielectric constant than that of the center region is provided in the end portion region of the facing region between the floating gate electrode 3 and the control gate electrode 5, parasitic capacitance between adjacent top faces of floating gate electrodes 3 is reduced, thereby malfunctions of the memory cells can be avoided.

As mentioned above, according to the first embodiment, (1) a high coupling ratio, (2) lowering of an electric field at an electrode end portion, and (3) reduction in parasitic capacitance between adjacent floating gate electrodes 3 are simultaneously realized.

Figure 13:
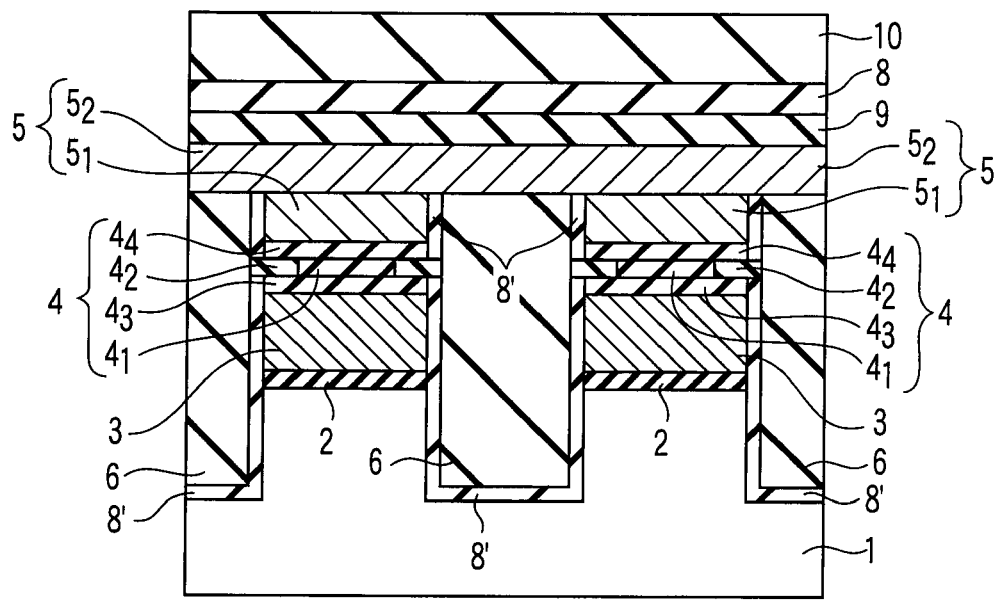
FIG. 13 is a cross-sectional view for explaining a modification of the second embodiment.

FIG. 13 shows a modification of the second embodiment. The third insulating films $4_3$ are provided on the top faces of the floating gate electrodes 3, and further the fourth insulating films $4_4$ are provided beneath the bottom faces of the lower layer portions $5_1$ of the control gate electrode 5. Thereby, the insulation property between the floating gate electrodes 3 and the control gate electrode 5 is improved, and the reliability of the memory cells is improved.

If the decreasing of electric capacitance between the floating gate electrode 3 and the control gate electrode 5 does not come into a problem, it is preferable to provide both the insulating films $4_3$ and $4_4$ because the effect for improving the insulation property is enhanced.

Figure 14:
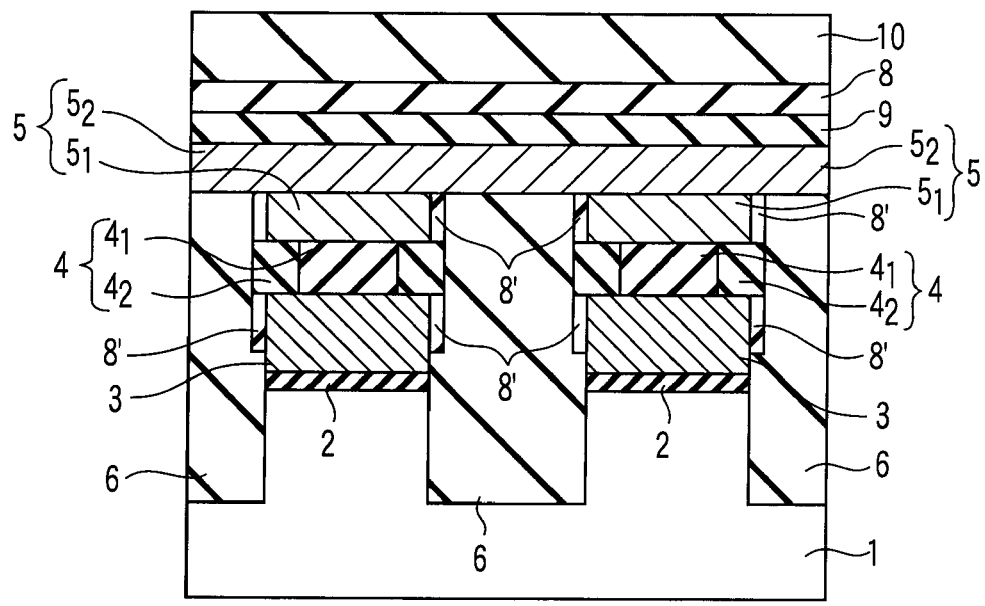
FIG. 14 is a cross-sectional view for explaining another modification of the second embodiment.

FIG. 14 is another modification of the second embodiment. The insulating film 8' comprising the high dielectric insulating film is configured to be removed from a vicinity of the tunnel insulating film 2 near the isolation region and from a surface of the silicon substrate 1 near the isolation region. Consequently, the quality of the tunnel insulating film 2 near the isolation region is improved, the breakdown voltage of the isolation region between active areas is improved and the junction leakage current is decreased, so that the reliability of the memory cells is enhanced.

Third Embodiment

FIG. 15 is a cross-sectional view depicting a semiconductor device in accordance with a third embodiment. This depicts a cross-sectional view of a plurality of memory cells neighboring in a bit line direction (channel length direction), and corresponds to FIG. 2 of the first embodiment.

The tunnel insulating film 2 is provided on the surface of the silicon substrate 1. The tunnel insulating film 2 comprises, for example, silicon oxide film or the silicon oxynitride film. The floating gate electrodes 3 are provided on the tunnel insulating film 2.

The control gate electrodes 5 are provided above the floating gate electrodes 3. The inter-electrode insulating films 4a are provided between the floating gate electrodes 3 and the control gate electrodes 5. The silicon nitride films 9 used as the processing masks are provided on the control gate electrodes 5. The insulating films other than the silicon nitride films 9 may be used as the processing masks.

As shown in FIG. 15, the widths of the inter-electrode insulating films 4a are wider than those of the floating gate electrodes 3 and the control gate electrodes 5 in the channel length direction, and both the end portions of the inter-electrode insulating films 4a protruded from the side-wall surfaces of the floating gate electrodes 3 and the control gate electrodes 5.

The exposed surfaces of the tunnel insulating film 2, the floating gate electrodes 3, the inter-electrode insulating films 4a and the control gate electrodes 5 are covered with the interlayer insulation film 10. Source/drain regions 7 are provided on the surface of the silicon substrate 1 so as to sandwich the channel regions of the memory cells.

Here, the materials of the inter-electrode insulating films 4a and the interlayer insulating film 10 are selected so that the dielectric constants of the inter-electrode insulating films 4a (first dielectric constants) are higher than those of the silicon nitride films 9 (about 7 by specific dielectric constant), and the dielectric constant of the interlayer insulating film 10 (second dielectric constant) is lower than that of the first dielectric constant.

The inter-electrode insulating film 4a is, for example, a hafnium aluminate film, a hafnia film or a lanthanum aluminate film. The inter layer insulating film 10 is, for example, a silicon oxide film, a silicon oxynitride film, or silicon nitride film. The combination of the inter-electrode insulating film 4a and the interlayer insulating film 10 is not limited to the foregoing combination. In addition, a case where insulating films having the same constituent elements are used as the inter-electrode insulating films 4a and the interlayer insulating film 10, the dielectric constants of the insulating films 4a and 10 can be changed by changing their elemental composition ratios.

It is preferable for the dielectric constant of the interlayer insulating film 10 to be smaller than that of the tunnel insulating film 2 so as to decrease parasitic capacitance between the floating gate electrodes 3 of adjacent memory cells.

According to the third embodiment, since the width of the inter-electrode insulating film 4a is wider than those of the floating gate electrode 3 and the control gate electrode 5, both the end portions of the inter-electrode insulating film 4a are protruded from the side walls of the floating gate electrode 3 and the control gate electrode 5, and the dielectric constant of the inter-electrode insulating film 4a is higher than that of the interlayer insulating film 10, the electric capacitance between the side-wall surface of the floating gate electrode 3 and the side-wall surface of the control gate electrode 5 increases to achieve a high coupling ratio, and thereby speeding up of operation or lowering of operation voltage is realized.

Figure 17:
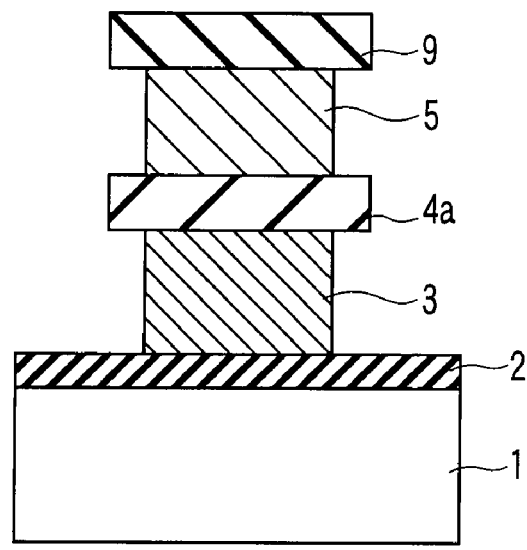
FIG. 17 is a cross-sectional view illustrating a manufacturing process for the semiconductor device of the third embodiment following FIG. 16.

A manufacturing method for the semiconductor device of the present embodiment will be described. The manufacturing method for the present embodiment differs from the conventional one relating to the process for the gate structure comprising the floating gate electrode 3, the inter-electrode insulating film 4a and the control gate electrode 5. Concrete examples (1) and (2) of the process for such the gate structure portion are as follows:

(1) First, a structure shown in FIG. 16 is formed by well known vertical processing method (e.g., an RIE process using a chlorine gas and an oxygen gas). Next, as shown in FIG. 17, the floating gate electrode 3 and the control gate electrode 5 comprising silicon are selectively narrowed in a lateral direction by isotropically etching the side-wall portions of the floating gate electrode 3 and the control gate electrode 5 by down flow etching method using fluorine radical, etc., that is one of isotropic dry etching method or by chemical solution processing method using potassium hydroxide or the like. down flow etching method using fluorine radical, etc., that is one of isotropic dry etching method or by chemical solution processing method using potassium hydroxide or the like.

(2) After forming the structure shown in FIG. 16, the following step is performed. That is, as shown in FIG. 18, the side-wall portions of the floating gate electrode 3 and the control gate electrode 5 comprising silicon is selectively narrowed in a lateral direction by isotropically altering surfaces of the side-wall portions into insulators 3ins and 5ins by radical oxidizing method using oxygen radical or the like as oxidizing species that is hard to bring about bird's beak oxidation or radical nitriding method using nitrogen radical or the like as nitriding species that is hard to bring about bird's beak nitriding.

FIG. 19 shows a modification of the third embodiment. The insulating films 4$_3$ constituting a part of the inter-electrode insulating films are provided on the top faces of the floating gate electrodes 3, further, the insulating films 4$_4$ constituting a part of the inter-electrode insulating films on the bottom faces of the lower layer portions 5$_1$ of the control gate electrodes 5. The insulating films 4$_3$ and 4$_4$ comprise, for example, silicon oxide films, silicon oxynitride films or silicon nitride films. By adding such insulating films 4$_3$ and 4$_4$, insulation between the floating gate electrodes 3 and the control gate electrodes 5 are improved, consequently, the reliability of the memory cells is improved.

Even by disposing only any one of the insulating films 4$_3$ and 4$_4$, the aforementioned effect is obtained. If the reduction in electric capacities between the floating gate electrodes 3 and the control gate electrodes 5 do not pose any problem, it is preferable to provide both the insulating films 4$_3$ and 4$_4$ because of increasing in the improvement of the insulation between the floating gate electrodes 3 and the control gate electrodes 5.

Figure 18:
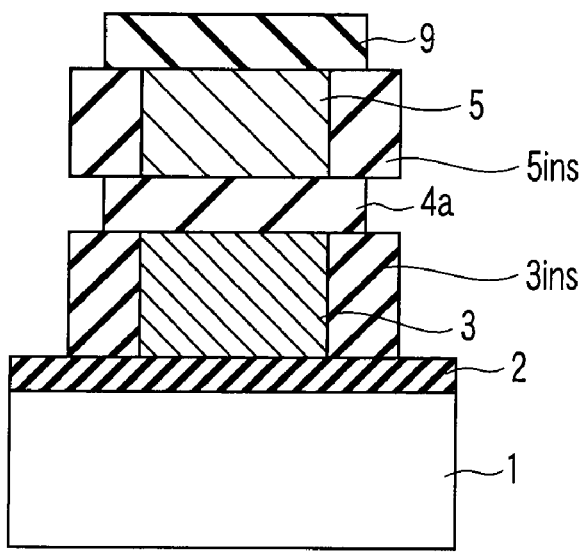
FIG. 18 is a cross-sectional view illustrating a manufacturing process for the semiconductor device of the third embodiment following FIG. 18.

The structure depicted in FIG. 19 is obtained by replacing the inter-electrode insulating film 4a by the insulating films 4$_3$, 4a and 4$_4$ in the step depicted in FIG. 16 to FIG. 18.

FIG. 20 shows another modification of the third embodiment. The widths of the floating gate electrodes 3a and the control gate electrodes 5a vary in a height direction, and the widths are narrowest at intermediate portions. Narrowing the widths of the floating gate electrodes 3a at the intermediate portions reduces the parasitic capacitance between the floating gate electrodes 3a of adjacent memory cells, thereby malfunctions of the memory cells can be avoided. In addition, narrowing the widths of the control gate electrodes 5a at the intermediate portions decreases the parasitic capacitance between adjacent word lines, thereby, speeding up of operation can be realized.

Concrete examples (1)-(3) of the structure shown in FIG. 20 are as follows:

(1) First, a tunnel insulating film, a first phosphorous-doped silicon layer (floating gate electrode), an inter-electrode insulating film, and a second phosphorous-doped silicon layer (control gate electrode) are successively formed on a silicon substrate. Next, a mask insulating film is formed on the second phosphorous-doped silicon layer, and processed into a mask pattern. Next, the second phosphorous-doped silicon layer is processed by RIE method by using the processed mask insulating film as a mask. Next, an upper portion of the second phosphorous-doped silicon layer is processed into an undercut shape by etching with chlorine gas and then a lower portion of the second phosphorous-doped silicon layer is processed into a skirt shape by etching with chlorine gas and a large amount of oxygen gases so as to form a thick protective film made of silicon oxide on the side-wall portion. Next, the inter-electrode insulating film is processed by RIE method using tetrafluocarbon dioxide gas or the like. Then, the first phosphorous-doped silicon layer is processed to be the same shape as the second phosphorous-doped silicon layer by RIE method in the same manner as the second phosphorous-doped silicon layer.

(2) The tunnel insulating film, the inter-electrode insulating film, and the mask insulating film are formed using material such as silicon nitride in which an oxidizing agent is hard to be permeated. Next, the gate structure including these insulating films is subjected to vertical processing by a well known RIE method or the like, thereafter, the floating gate electrode and the control gate electrode are narrowed in lateral direction by converted the surfaces of the side-wall portions of the floating gate electrode and the control gate electrode into oxide by thermal oxidation method. Since the amount of supplied oxidizing agent decreases toward upper layer portions and lower layer portions of the floating gate electrode and the control gate electrode, the structure having the shape depicted in FIG. 20 is obtained.

(3) In the foregoing (2), the floating gate electrode and the control gate electrode are formed of silicon layers having different amount of doped phosphorous in a thickness direction. Here, the phosphorous is doped in the silicon layers such that concentration of the phosphorous is high at the center portions of the floating gate electrode and the control gate electrode and the concentration of the phosphorous decreases toward the upper layer portions and the lower layer portions of the floating gate electrode and the control gate electrode, which results in making the oxidation rate at the time of the thermal oxidation of the side-wall portions higher toward the center portion, consequently, the structure having the shape shown in FIG. 20 is obtained.

FIG. 21 shows yet another modification of the third embodiment. The widths of floating gate electrodes 3b and the control gate electrodes 5b vary in a height direction to be the widest at the intermediate portions, cross-sectional shapes of the lower end portions and the upper end portions of the floating gate electrode s 3b and cross-sectional shapes of the lower end portions of the control gate electrodes 5b show obtuse angles. Therefore, electric fields between the silicon substrate 1 and the lower end portions of the floating gate electrodes 3b are lowered, in addition the electric fields between the upper end portions of the floating gate electrodes 3b and the lower end portions of the control gate electrodes 5b are lowered. Thereby, local leakage current at the electrode end portions are suppressed, and this enables the memory cells to be high in reliability.

Concrete examples (1) and (2) of process for the structure shown in FIG. 21 are as follows:

(1) The tunnel insulating film, the inter-electrode insulating film, and the mask insulating film are formed using material such as silicon oxide in which an oxidizing agent is easily permeated. Next, the gate structure including these insulating film is subjected to vertical processing by well known RIE method or the like, thereafter, the floating gate electrode and the control gate electrode are narrowed in a lateral direction by converted the surfaces of the side-wall portions of the floating gate electrode and the control gate electrode into oxide by thermal oxidation method. Since the amount of supplied oxidizing agent increases toward upper layer portions and lower layer portions of the floating gate electrode and the control gate electrode, the structure having the shape depicted in FIG. 21 is obtained.

(2) In the foregoing (1), furthermore, the floating gate electrodes and the control gate electrodes are formed of silicon layer having different amount of phosphorous in a thickness direction. Here, the phosphorous is doped in the silicon layers such that concentration of the phosphorus is low at the center portions of the floating gate electrode and the control gate electrode and the concentration of the phosphorus increases toward the upper layer portions and the lower layer portions of the floating gate electrode and the control gate electrode, which results in making the oxidation rate at the time of thermal oxidation of the side-wall portions lower toward the center portion, consequently, the structure having the shape shown in FIG. 21 is obtained.

Figure 22:
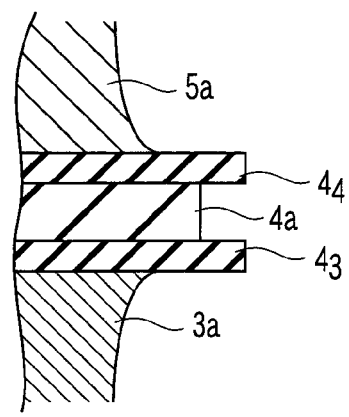
FIG. 22 is a cross-sectional view for explaining a modification of a structure illustrated in FIG. 20.

FIG. 22 shows a modification of the structure depicted in FIG. 20 and shows an enlarged cross-sectional view of the electrode side-wall portion. In the structure shown in FIG. 22, the insulating films $4_3$, $4_4$ are protruded from the insulating film 4a, and further, the parasitic capacities between adjacent memory cells are decreased by employing the floating gate electrode 3a and the control gate electrode 5a having cross-sectional shapes depicted in FIG. 22.

Concrete examples (1) and (2) of process for the structure shown in FIG. 22 are as follows:

(1) After vertical RIE processing for the tunnel insulating film, the first silicon layer (floating gate electrode), inter-layered electrode insulating film, and the second silicon layer (control gate electrode), the surfaces subjected to the processing are cleaned by chemical solution such as dilute hydrofluoric acid. At this time, due to the difference of etching rate of the materials of stacked inter-electrode insulating films, the shape whose side surface positions are different as shown in FIG. 22 are formed. Next, the side-wall portions of floating gate electrode 3a and the control gate electrode 5a are narrowed in a lateral direction by down flow etching method or method using chemical solution. At this time, since the amount of the supplied etching agents is decreased in the vicinity of the stacked inter-electrode insulating film, the structure having the shape shown in FIG. 22 is obtained.

(2) The inter-layered electrode insulating film having the shape depicted in FIG. 20 is formed, which comprises the upper and lower layers formed of material such as silicon nitride in which oxidizing agent is hard to be permeated, thereafter, the side-wall portions of the floating gate electrode and the control gate electrode are oxidized by thermal oxidation method. At this time, since the oxidizing reagent is not supplied to the top face portion of the floating gate electrode and the bottom face portion of the control gate electrode through the silicon nitride (silicon nitride film), and the bird's beak oxidation does not occur, thus, the structure having the shape shown in FIG. 22 is obtained.

Figure 23:
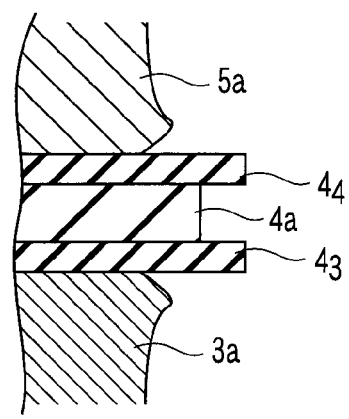
FIG. 23 is a cross-sectional view for explaining another modification of the structure illustrated in FIG. 20.

FIG. 23 shows another modification of the structure depicted in FIG. 20, and shows an enlarged cross-sectional view of the electrode side-wall portion. In the structure shown in FIG. 23, the insulating films $4_3$, $4_4$ are protruded from the insulating film 4a, further the cross-sectional shape of the edge portions on the inter-electrode insulating film sides are rounded, thereby, both the reduction of parasitic capacitance between adjacent memory cells and the lowering of the electric field of the electrode end portion are realized.

The following will describe a concrete example of the process for the structure shown in FIG. 23.

The stacked inter-electrode insulating film having the shape depicted in FIG. 20 are formed, which comprises the upper and lower layers formed of material such as silicon oxide in which oxidizing agent is easily permeated, thereafter, the side-wall portions of the floating gate electrode and the control gate electrode are oxidized by thermal oxidation method. At this time, since the oxidizing agent is supplied to the vicinity of the side-wall of the top face portion of the floating gate electrode and the side-wall portion of the bottom face portion of the control gate electrode through the silicon oxide (silicon oxide film), and the bird's beak oxidation occurs, thus, the structure shown in FIG. 23 is obtained.

Figure 24:
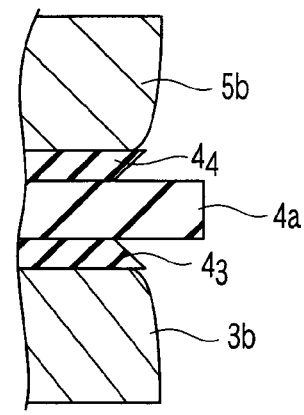
FIG. 24 is a cross-sectional view for explaining yet another modification of the structure illustrated in FIG. 20.

FIG. 24 shows yet another modification of the structure depicted in FIG. 21, and shows an enlarged cross-sectional view of the electrode side-wall portion. In the structure shown in FIG. 23, the insulating film 4a is protruded from the insulating film $4_3$, $4_4$. Further, the electric field at the electrode end portion is lowered by employing the floating gate electrode 3b and the control gate electrode 5b each having the cross-sectional shapes shown in FIG. 21.

A concrete example of the process for the structure shown in FIG. 24 will be described hereinafter.

The upper and lower layers of the inter-layered electrode insulating film are formed of silicon nitride films, and the intermediate layer of the inter-layered electrode insulating film is formed of material, such as alumina in which oxidizing agent is easily permeated. After the forming the inter-layered electrode insulating film having a shape depicted in FIG. 21, the side-wall portions are oxidized by radical oxidation method capable of oxidizing the silicon nitride film. At this time, since the oxidizing agent is supplied to the vicinity portions of the side walls of the upper and the lower silicon nitride films through the alumina (alumina films), the bird's beak oxidation occurs to convert the silicon nitride films into the silicon oxide films. Moreover, since the oxidizing agent is also supplied to the top face portion of the floating gate electrode and the bottom face portion of the control gate electrode, the structure shown in FIG. 24 is obtained.

In addition, the high dielectric constant insulating film (high-k film) covering the side-wall surfaces of the floating gate electrode 3 and the control gate electrode 5 may be provided.

Fourth Embodiment

Figure 25:
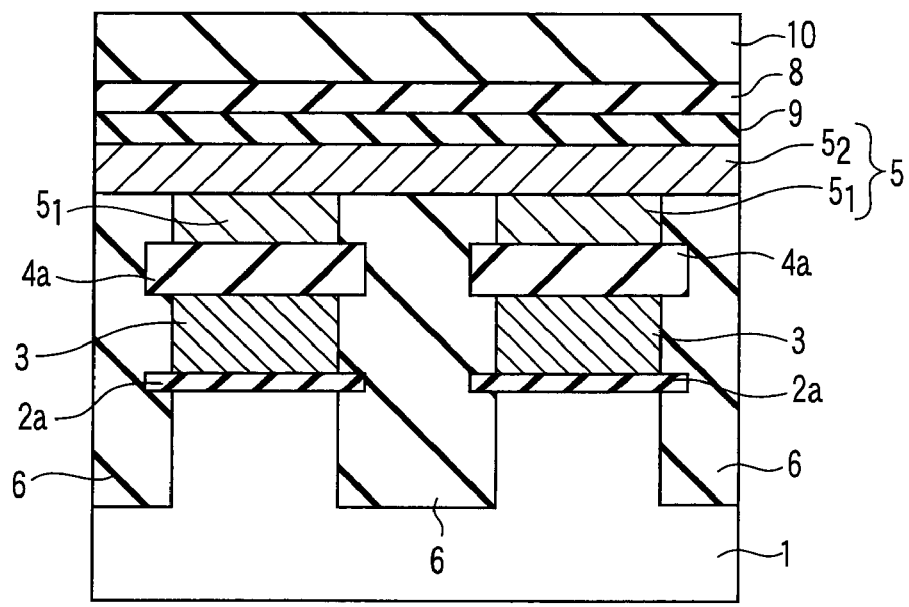
FIG. 25 is a cross-sectional view illustrating a semiconductor device in accordance with a fourth embodiment.
Figure 26:
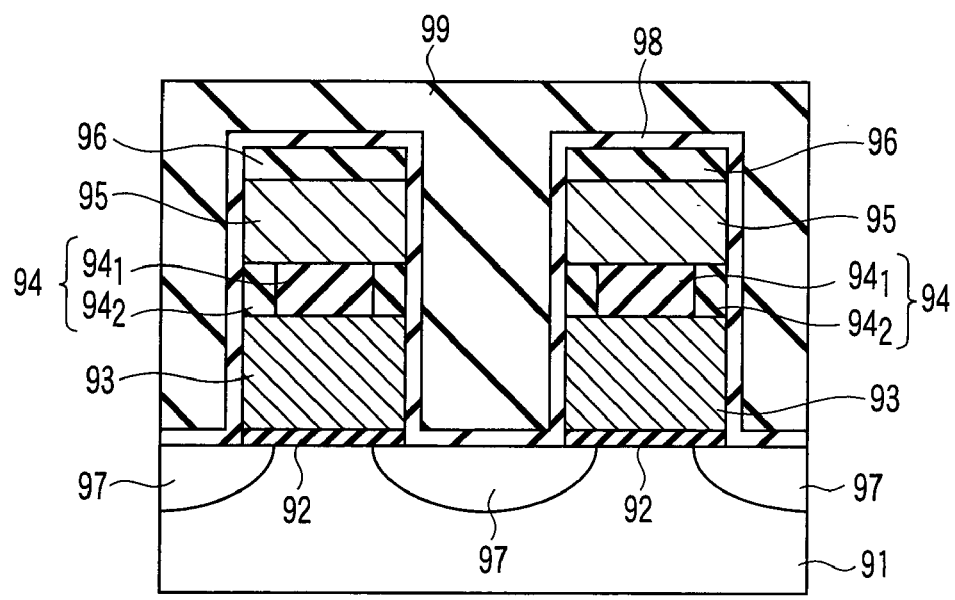
FIG. 26 is a cross-sectional view illustrating a conventional semiconductor device.

FIG. 25 shows a cross-sectional view illustrating a semiconductor device in accordance with the fourth embodiment.

This cross-sectional view shows cross-sections of a plurality of memory cells adjacent to one another in the word line direction (channel width direction).

The present embodiment differs from the prior art in that relating to the channel width direction, the widths of the tunnel insulating film 2a and the inter-electrode insulating film 4a are wider than those of the floating gate electrode 3 and the control gate electrode 5, and both the end portions of the inter-electrode insulating film 4a are protruded from the side-wall surfaces of the floating gate electrode 3 and the control gate electrode 5. Hereinafter, the detail of the present embodiment will be described.

An isolation region (STI) is provided on the surface of the silicon substrate 1, and the isolation (STI) defines an active area in the silicon substrate 1 including the channel regions of the memory cells.

The tunnel insulating films 2 are provided on the active areas. The tunnel insulating films 2 comprise, for example, a silicon oxide films or a silicon oxynitride films. The floating gate electrodes 3 are provided on the tunnel insulating films 2.

The lower layer portions $5_1$ of the control gate electrodes 5 are provided above the floating gate electrodes 3. The inter-electrode insulating films 4a are provided between the floating gate electrodes 3 and the lower layer portions $5_1$ of the control gates electrodes 5.

The materials of the inter-electrode insulating film 4a and the isolation insulating film 6 are selected so that the dielectric constant (first dielectric constant) of the inter-electrode insulating film 4a is higher than that of the silicon nitride film (about 7 by relative dielectric constant) and the dielectric constant (second dielectric constant) of the isolation insulating film 6 is lower than the first dielectric constant.

Here, the interlayer insulating film 10 is an insulating film covering the side-wall surfaces of the floating gate electrode 3 and the control gate electrode 5, it is desirable for the material of the insulating film 10 to be selected so that the dielectric constant is lower than the first dielectric constant like the third embodiment.

The inter-electrode insulating film 4a is, for example, an alumina film, hafnium aluminate film, a hafnia film or a lanthanum aluminate film. The isolation insulating film 6 is, for example, a silicon oxide film, a silicon oxynitride film or a silicon nitride film. The combination between the inter-electrode insulating films 4aand the isolation insulating film 6 is not limited to the foregoing combination. In addition, in a case where insulating films having the same constituent elements are used as the inter-electrode insulating film 4a and the isolation insulating film 6, the dielectric constants of the insulating films 4 and 6 can be changed by changing their elemental composition ratios.

In the present embodiment, the exposed surfaces of the silicon substrate 1, the tunnel insulating film 2, the floating gate electrodes 3, the inter-electrode insulating films 4a and the lower layer portions $5_1$ of the control gate electrodes 5 are covered with the isolation insulating film 6, although other structure may be used. That is, the insulating film covering the exposed surfaces and the insulating film filling the isolation trench may comprise different materials respectively, if the materials have lower dielectric constants lower than the first dielectric constant. In addition, it is desirable that the dielectric constant of the insulating film filling the isolation trench is smaller than the dielectric constant of the tunnel insulating film because the parasitic capacitance between the floating gate electrodes 3 of adjacent memory cells is decreased.

According to the fourth embodiment, since the width of the inter-electrode insulating film 4a is wider than that of the floating gate electrode 3 of the lower layer portion $5_1$ of the control gate electrode 5, and both the end portions of the inter-electrode insulating film 4a are protruded from the side wall of the control gate electrode 5, the electric capacitance between the side-wall surface of the floating gate electrode 3 and the side-wall surface of the control gate electrode 5 increases to achieve a high coupling ratio, and thereby speeding up of operation or lowering of operation voltage is realized.

The effect of "realization of high coupling ratio" of the embodiments mentioned above, becomes preeminent when the width of the floating gate or the control gate electrode in the channel length direction or the channel width direction of the cell is not more than 50 nm, and the effect becomes larger as the width becomes shorter.

Especially, in the first embodiment, it is desirable that the thickness of the liner insulating film of the side-wall portion of the floating gate electrode/control gate electrode is set not less than 20% of the width in the channel length direction of the floating gate electrode/control gate electrode side. In addition, in the second embodiment, it is desirable that the thickness of the liner insulating film of the side-wall portions of the floating gate electrode/control gate electrode is set not less than 20% of the width in the channel width direction of the floating gate electrode/control gate electrode side. In the third embodiment, it is desirable that the protrusion length of the inter-electrode insulating film of the third embodiment is set not less than 20% of the width in the channel length direction of the floating gate electrode/control gate electrode side. In the fourth embodiment, it is desirable that the protrusion length of the inter-electrode insulating film is set not less than 20% of the width in the channel width direction of the floating gate electrode/control gate electrode side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate; and
   a plurality of nonvolatile memory cells provided on the semiconductor substrate,
   each of the plurality of nonvolatile memory cells comprising:
   a channel region provided on the semiconductor substrate and having a channel length and a channel width;
   a tunnel insulating film provided on the channel region;
   a floating gate electrode provided on the tunnel insulating film;
   a control gate electrode provided above the floating gate;
   an inter-electrode insulating film provided between the floating gate electrode and the control gate electrode; and
   an electrode side-wall insulating film provided on side-wall surfaces of the floating gate electrode and the control gate electrode,
   the inter-electrode insulating film including a first insulating film having a first dielectric constant and a second insulating film having a second dielectric constant,
   the first dielectric constant being higher than the second dielectric constant, the second dielectric constant being higher than a dielectric constant of a silicon nitride film,
   the first insulating film being provided in a central region of a facing region between the floating gate electrode and the control gate electrode, the second insulating film being provided in both end regions of the facing region and protruding from the both end regions, wherein the central region is a region of the facing region except for the both end regions.

2. The semiconductor device according to claim 1, wherein the second insulating film and the electrode side-wall insulating film comprise insulating films of the same material.

3. The semiconductor device according to claim 1, further comprises a silicon oxide film, a silicon oxynitride film or a silicon nitride film provided at least one of a region between the floating gate electrode and the inter-electrode insulating film and a region between the control gate electrode and the inter-electrode insulating film.

4. The semiconductor device according to claim 2, further comprises a silicon oxide film, a silicon oxynitride film or a silicon nitride film provided at least one of a region between the floating gate electrode and the inter-electrode insulating film and a region between the control gate electrode and the inter-electrode insulating film.

5. The semiconductor device according to claim 1, wherein a width of the floating gate electrode or a width of the control gate electrode in a direction of the channel length or the channel width is not wider than 50 nm.

6. The semiconductor device according to claim 2, wherein a width of the floating gate electrode or a width of the control gate electrode in a direction of the channel length or the channel width is not wider than 50 nm.

7. The semiconductor device according to claim 3, wherein a width of the floating gate electrode or a width of the control gate electrode in a direction of the channel length or the channel width is not wider than 50 nm.

8. The semiconductor device according to claim 4, wherein a width of the floating gate electrode or a width of the control gate electrode in a direction of the channel length or the channel width is not wider than 50 nm.

\* \* \* \* \*